United States Patent
O'Flynn

(10) Patent No.: US 9,523,737 B2
(45) Date of Patent: Dec. 20, 2016

(54) INSERTION OF FAULTS INTO COMPUTER SYSTEMS

(71) Applicant: Colin O'Flynn, Halifax (CA)

(72) Inventor: Colin O'Flynn, Halifax (CA)

(73) Assignee: NewAE Technology Inc., Halifax (CA)

( * ) Notice: Subject to any disclaimer, the term of this patent is extended or adjusted under 35 U.S.C. 154(b) by 124 days.

(21) Appl. No.: 14/588,959

(22) Filed: Jan. 4, 2015

(65) Prior Publication Data

US 2016/0196196 A1   Jul. 7, 2016

(51) Int. Cl.
  *G01R 31/317*   (2006.01)
  *G06F 11/263*   (2006.01)
  *G01R 31/00*    (2006.01)

(52) U.S. Cl.
  CPC ....... *G01R 31/31721* (2013.01); *G06F 11/263* (2013.01); *G01R 31/00* (2013.01)

(58) Field of Classification Search
  CPC ..... G01R 31/00; G01R 31/001; G01R 31/002; G01R 31/31721; G01R 31/31725; G06F 11/22; G06F 11/263; G06F 11/27
  USPC .......................................................... 714/41
  See application file for complete search history.

(56) References Cited

U.S. PATENT DOCUMENTS

| | | | |
|---|---|---|---|
| 6,429,674 B1 * | 8/2002 | Barth | G01R 31/001 324/676 |
| 7,285,962 B2 * | 10/2007 | Bogdanski | G06F 11/24 324/603 |
| 7,696,771 B2 * | 4/2010 | Tanaka | G01R 31/31901 324/764.01 |

* cited by examiner

*Primary Examiner* — Joseph Kudirka

(57) ABSTRACT

Methods and apparatus are provided for causing the incorrect operation ('faults') of digital devices such as embedded computer systems or integrated circuits. The apparatus uses a switching element to cause perturbations on the power supplies of the digital device. This apparatus can be connected to existing embedded systems with a minimal of modifications, and can insert a variety of faults into those embedded systems. Such faults can be used for verification of fault-tolerant systems or algorithms, including both safety-critical designs and cryptographic designs.

16 Claims, 6 Drawing Sheets

INSERTION OF FAULTS INTO COMPUTER SYSTEMS

FIELD OF THE INVENTION

The present invention relates generally to testing digital circuits, and, more particularly, a system for causing digital circuits to generate erroneous results.

BACKGROUND

Digital systems are designed by assuming the hardware and software being used follows certain logical rules. The addition of two numbers, for example, is assumed to generate the correct result. In certain instances the system will operate incorrectly, and can fail to generate the correct results.

Safety-critical systems—such as found in automotive, industrial, and military applications—cannot tolerate failures caused by incorrect functioning of their embedded computer systems. These safety-critical systems may incorporate fault-detection or fault-correction circuitry or algorithms. This requires a way of validating that the fault-detection or fault-correction circuitry itself is operating correctly.

One way of validation is to use a simulation of the system to arbitrarily insert faults. These faults could be inserted at selected locations of special importance, or inserted at random while monitoring the output for any errors.

For testing a complete system, the system or components of the system will often be specially instrumented to allow the injection of faults. Such instrumentation allows the corruption of certain memory bits, or to cause incorrect calculation results.

Further applications of fault injections are found for testing of built-in self-tests ('BISTs') in digital components, such as found in dynamic random access memory ('DRAM') modules. Again the objective is the insertion of faults into a digital device. These faults should be detected by the BISTs which are used during normal functioning of the digital device.

In addition, for cryptographic applications the algorithms must be protected against the injection of faults. If even a single computation in a cryptographic algorithm occurs incorrectly, it may be possible for an attacker to determine the secret which the cryptographic algorithm is designed to protect. A number of patents aim to project the algorithms against such attacks, see for example: U.S. Pat. No. 8,861,718; U.S. Pat. No. 7,694,156; and U.S. Pat. No. 8,720,600. A way of evaluating these algorithms is required to be confident that inserted faults will be detected or corrected by the proposed algorithm.

BRIEF SUMMARY

The state of the art in fault injection frequently requires the modification of the Device Under Test ('DUT'), or the use of bulky instruments which allow testing of the DUT only in laboratory conditions. The use of a circuit which is capable of precisely shorting one of the power supplies for the digital device significantly reduces the complexity of inserting the faults. This short occurs for a very small and controlled amount of time; typically the length of time the short is applied for ranges from about 1 nS to 1 mS. This apparatus and method allows the insertion of a variety of faults which can cause incorrect computational results, corrupt memory information, or cause invalid states to be entered.

This apparatus can be used to insert faults onto digital devices at many different scales. For example faults can be inserted into: a microprocessor that is running a general-purpose operating system, a microcontroller running specialized control software, hardware devices performing cryptographic operations, memory devices, Field Programmable Gate Arrays ('FPGAs'), and many other digital devices.

This apparatus can take the form of a laboratory instrument which is temporarily connected to an existing DUT, such as connecting the apparatus to a fault-tolerant computer being used in an automotive application, with the objective being to validate the fault-tolerance of this computer. The apparatus can also be integrated into a digital system for testing of the system in-place. This apparatus can, for example, be integrated onto the circuit board or directly onto the integrated circuit die.

This apparatus is designed to only temporarily interrupt the power supply of the DUT. The use of a switching element to short the power supply of a device has an extensive history in 'crowbar' protection circuits, such as taught in U.S. Pat. No. 7,924,538. These protection circuits are designed to short the power supply for an extended period of time to prevent excess voltage from reaching a protected device. Instead, the invention claimed herein is designed to short the power supply for very small periods of time, and with high temporal accuracy and precision.

In addition the connection of the switching element is as close to the DUT as possible, in order to cause the desired faults without causing undesired faults. Examples of desired faults would be incorrect calculation results or the corrupting of memory locations, whereas undesired faults might include the DUT resetting. The parameters of the switching element can be modified to avoid exceeding power supply limits, for example adding a resistor to limit current passed by the switching element.

Examples of uses of this invention include validation of fault-detection algorithms, testing of cryptographic devices, testing of safety-critical devices, and run-time testing of embedded computer systems which are claimed to be fault-tolerant.

BRIEF DESCRIPTION OF THE DRAWINGS

For a more complete understanding of the invention, reference is made to the following description and accompanying drawings, in which.

DETAILED DESCRIPTION

Digital systems are assumed to follow certain logical rules. A software program can test the value of a variable, and depending the value of said variable will begin two different operations. For example, an embedded computer in an automotive application may use such logic to determine when to deploy airbags based on the results of calculation of acceleration forces. Such calculations may occasionally give an incorrect result, despite the underlying algorithm and implementation of said algorithm being error-free—this incorrect result instead occurring due to a 'fault' in a component or portion of the embedded computer. Such faults can occur due to manufacturing defects, radiation exposure, or electromagnetic interference.

Safety-critical systems—such as found in automotive, industrial, and military applications—cannot tolerate failures caused by incorrect functioning of their embedded computer systems. These safety-critical systems may incorporate fault-detection or fault-correction circuitry or algorithms. Validation that the fault-detection or fault-correction is functioning correctly requires an apparatus capable of inserting known faults into the embedded computer system, and verifying said faults are detected.

Examples of faults inserted using the invention described herein include but are not limited to (a) an instruction that is executed by the Device Under Test ('DUT') which returns an incorrect result, (b) the incorrect value being read from memory in the DUT, (c) the incorrect value being stored to memory in the DUT, (d) a logic network in the DUT which generates an incorrect result, (e) timing errors introduced in the DUT, or (f) causing the DUT to execute instructions in the incorrect order.

Under the broad definition of faults, a variety of undesired effects are also encompassed. The embedded computer system could be made to become completely inoperative, or to reset and begin program execution as if power had been removed and applied. These effects are not considered the desired faults which the apparatus described herein is capable of generating, as such undesired effects can be readily generated using well-known means.

Figure 1:
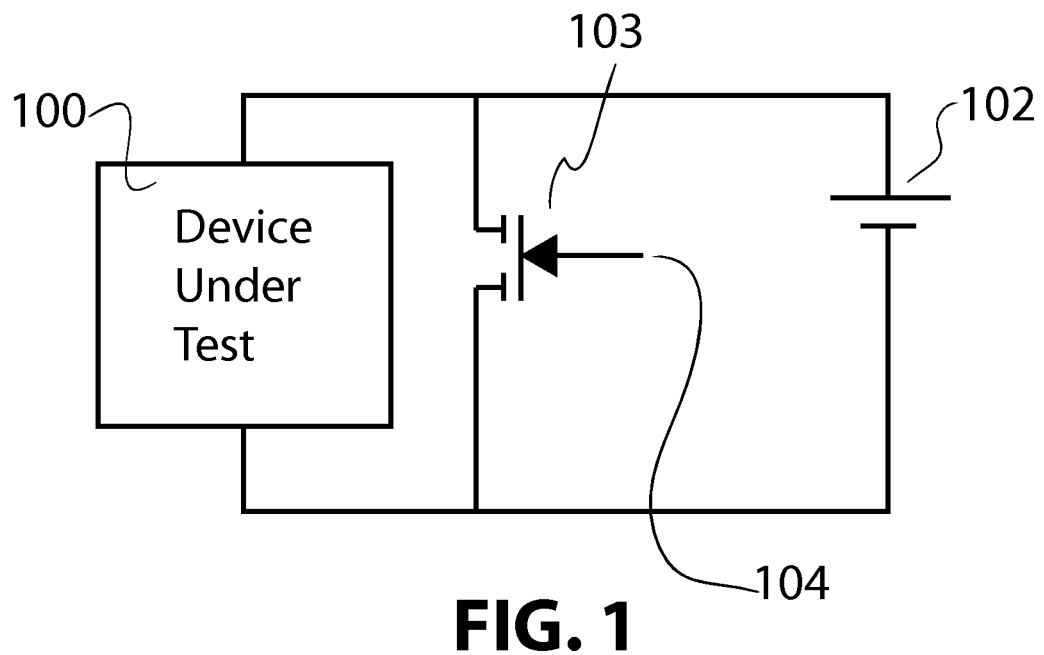
FIG. 1 demonstrates a way of generating faults in a digital system using the invention.

In FIG. 1 an example is shown where it is desired to insert a fault into digital device 100, the DUT. The fault is inserted by using a switching element 103 to short the power supply 102 of the digital device, where the duration of the short is controlled by signal 104. This short causes the voltage of the DUT to fall below normal operating voltage for a duration of time as controlled by 104.

Figure 2:
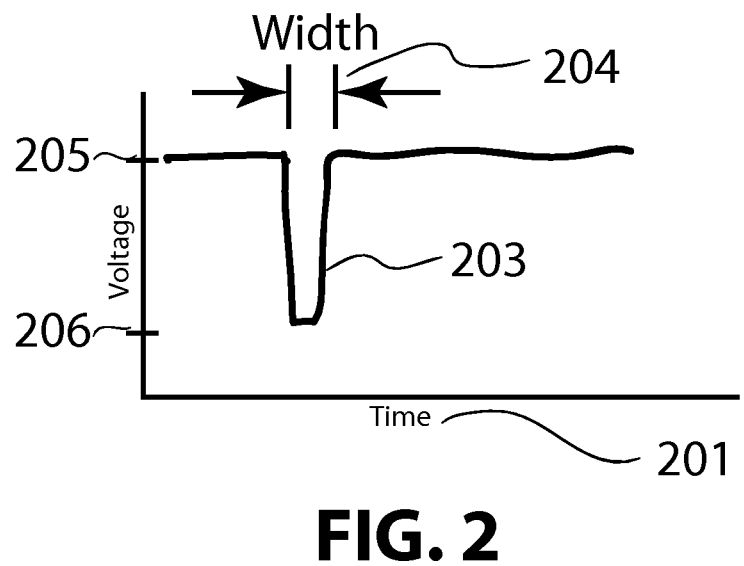
FIG. 2 shows an example of a voltage waveform generated in a digital device.

A graph of the supply voltage during an example of a fault injection is shown in FIG. 2. The voltage at the DUT 100 is plotted against time 201. During the fault insertion 203 the voltage falls from the normal level 205 to a lower level 206. The length of the fault 204 can be adjusted to cause various results in the device being tested.

Figure 3:
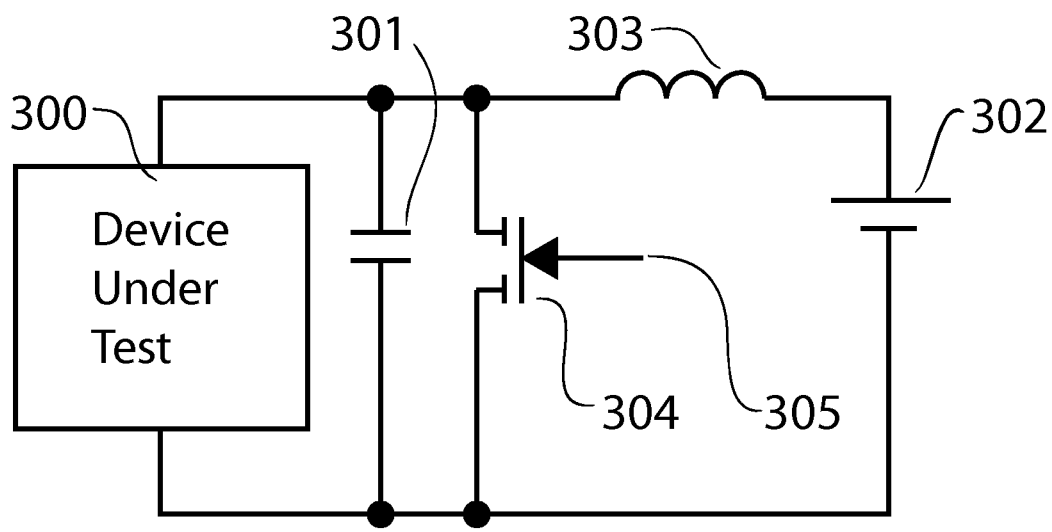
FIG. 3 shows another example of generating faults where a power distribution network is present.

In practical systems, as in FIG. 3, the DUT 300 is likely to have a power distribution network, which consists of one or more decoupling capacitors 301. The power supply 302 will effectively have an inductor 303 in series with the supply. This inductor may be present by design—such as a system having a filter in the power supply—or may be the result of conductive lines such as printed circuit board tracks or bonding wires inside an integrated circuit, which separate the power supply 302 from the DUT 300.

Figure 4:
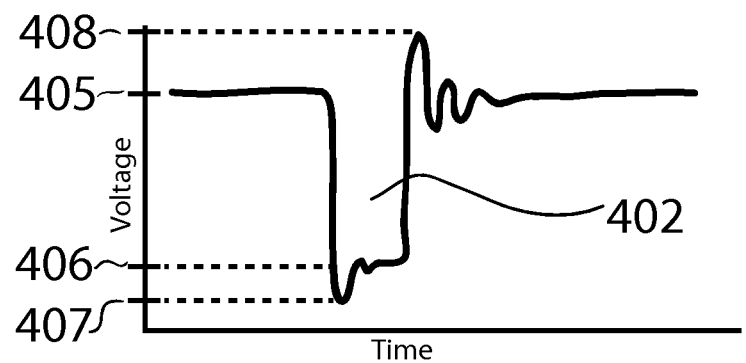
FIG. 4 shows an example of a voltage waveform generated when a power distribution network is present.

The fault insertion mechanism is the digital switch 304, which is controlled by signal 305. When the switch 304 is closed for a short period the fault is inserted. The resulting waveform is shown in FIG. 4, which appears slightly different from the simple waveform of FIG. 2. As in FIG. 2, there is a standard operating voltage 405 which the DUT 300 normally operates at. During the insertion of the fault 402 the voltage falls to a lower level 406, but it may first undershoot to another level 407. Similarly the voltage may later overshoot the standard operating voltage 405 to level 408, before returning eventually to standard voltage 405.

The undershoot level 407 and overshoot level 408 may further improve the ability of the switching element 304 to insert faults. The values of these levels will depend on the parameters of the capacitor 301, inductor 303, and switching element 304. In particular parameter such as the rise time, fall time, and resistance of the switching element 304 can be modified to improve the reliability of this apparatus to cause the desired fault condition(s) in the DUT 300.

Figure 5:
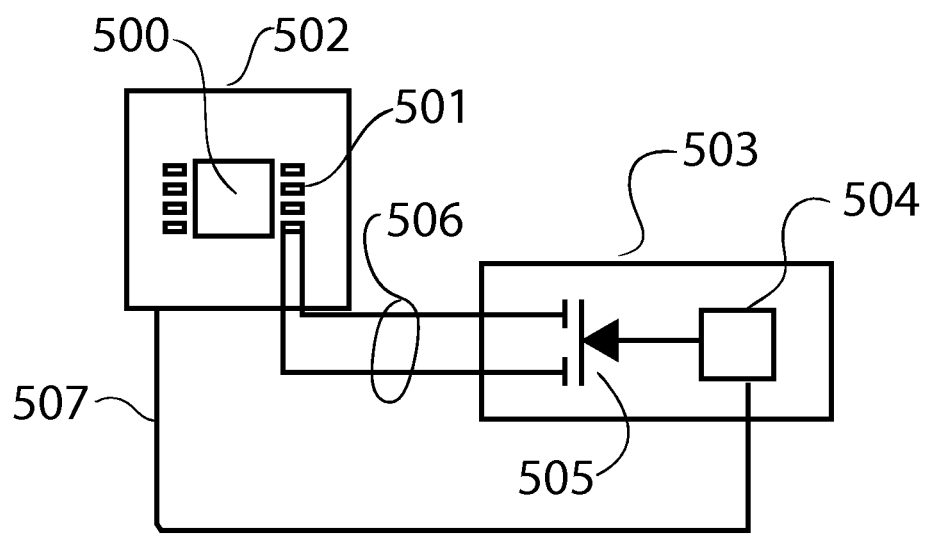
FIG. 5 shows an embodiment of the invention being connected to a complete circuit board.

One embodiment of this apparatus is a stand-alone test equipment, as in FIG. 5. The DUT 502 includes a digital device 500, possibly with power distribution components 501 such as decoupling capacitors. The switching element 505 is contained inside of a portable test equipment device 503, with a control system 504 determining the length of time and temporal location that the switching element 505 is closed for. The switching element is connected using test probes 506 to the DUT 502, examples of such probes include wires soldered onto the DUT 502, a probe making temporary connection, or modification of power distribution components 501 to make connection to the test apparatus 503.

The probes 506 are connected to the DUT 502, but the digital device 500—which is a component of the DUT 502—is the actual target of the fault. When the probes 506 are connected to DUT 502, the objective should be to create a large perturbation in the power delivered to the digital device 500. If the digital device 500 was, for example, a microprocessor in Ball Grid Array ('BGA') packaging, the probes could be connected to vias underneath the BGA package which deliver power to the microprocessor. Modifications to the switching element 505 may be required to avoid damaging the power supply of the DUT 502, for example having a small valued resistor in series with the switching element 505 to limit maximum current.

The test apparatus 503 may optionally be connected to the DUT 502 using a trigger line 507. This trigger line can be used to determine when the switching element 505 should be enabled, in order to insert the desired fault into the target digital device 500 of the DUT 502. The control system 504 may insert a temporal offset from the trigger condition being satisfied until the switching element 505 is closed for insertion of the fault.

This trigger line 507 can also provide communication with the digital device 500. This can be used to determine if the correct fault has been inserted. As will be apparent to those skilled in the art, if the switching element 505 is operated for an extended period of time the digital device 500 will fail to operate completely, or may simply reset. Extensive testing of the parameters of the switching element 505 operation such as temporal location of the switch closure and length of closing the switch relative to digital device 500 operations may be required to obtain the desired fault injection.

Figure 6:
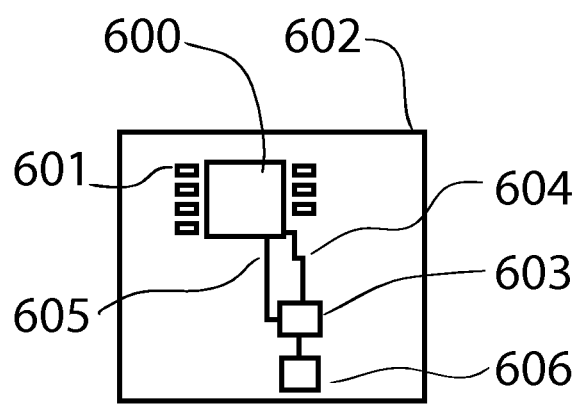
FIG. 6 shows an embodiment of the invention integrated into a digital system.

Alternatively, the DUT and test apparatus might be integrated into a single embedded system. This is shown in FIG. 6, where the DUT 600 is a digital device mounted on a substrate 602, an example of said substrate being a printed circuit board. A switching element 603 is connected to a power supply 604 of the DUT 600, allowing the insertion of faults into DUT 600. The control of the switching element 603 could be performed by another device 606 which is also mounted on substrate 602. Alternatively the control of the fault insertion could be performed by the DUT 600 itself, as shown by interconnection 605 between the DUT 600 and switching element 603.

The DUT 600 may again be part of a power distribution network 601. The switching element 603 can be used to short this power distribution network out locally for the DUT 600, inserting a fault into DUT 600.

Figure 7:
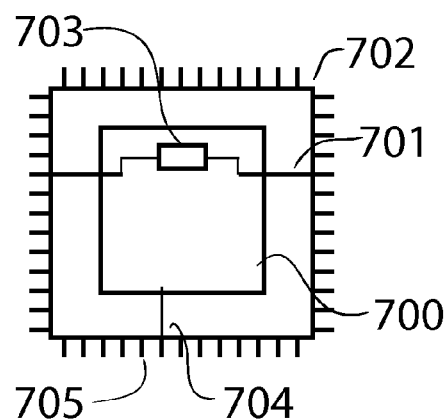
FIG. 7 shows an embodiment of the invention integrated into an integrated circuit.

As in FIG. 7, it is also possible to integrate this arrangement directly into an integrated circuit. In this example the integrated circuit 702 includes a 'die' 700, which contains the digital and/or analogue circuitry. This die may be connected by a plurality of bonding wires 704 to a plurality of external pins 705. The switching element 703 is integrated onto the die 700 as part of the circuitry of the device. This allows the insertion of faults by shorting power supply connections 701 on the die.

Figure 8:
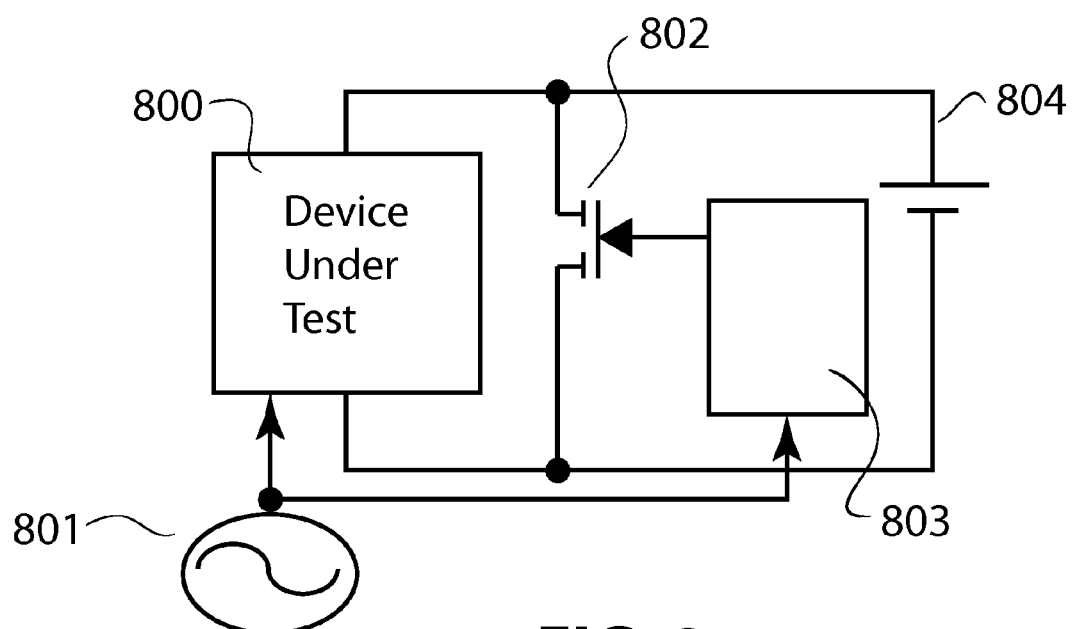
FIG. 8 shows the use of the clock from the DUT to improve synchronization.

The triggering of the fault can be made dependant on a device clock related to the DUT operation, as shown in FIG. 8. Here the DUT 800 has a clock 801 and power supply 804. The switching element 802 used to insert faults is controlled by a digital processor 803 which also has access to the DUT clock 801. When attempting to cause faults during the operation of DUT 800 it may be required to synchronize the location of fault inserted to the device clock 801. Such a system might require a known or constant offset to the faults injected using the switching element 802 from clock edges of the clock 801 driving the digital device 800.

Figure 9:
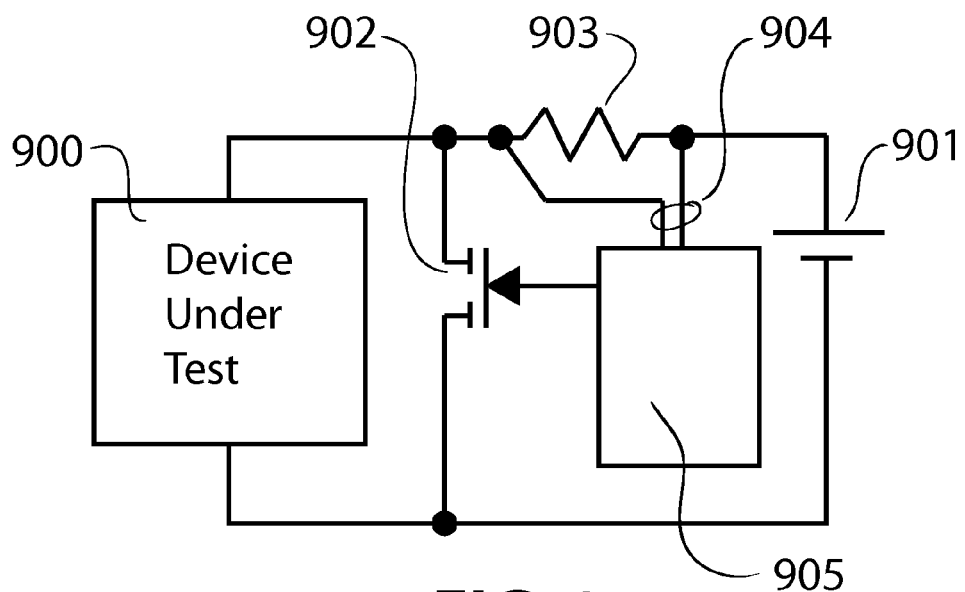
FIG. 9 shows the use of an internal state of the DUT to trigger the fault injection.

The triggering of the fault may also be made dependant on other measures of the internal state of the digital device. In FIG. 9, the digital device 900 again has power supply 901. The switching element 902 is used to inject faults. A shunt resistor 903 is used to perform power measurements 904, where the processing system 905 can use said power measurements to determine when the digital device 900 is performing an operation of interest. When the digital device is performing an operation of interest the switching element 902 is used to insert a fault.

Figure 10:
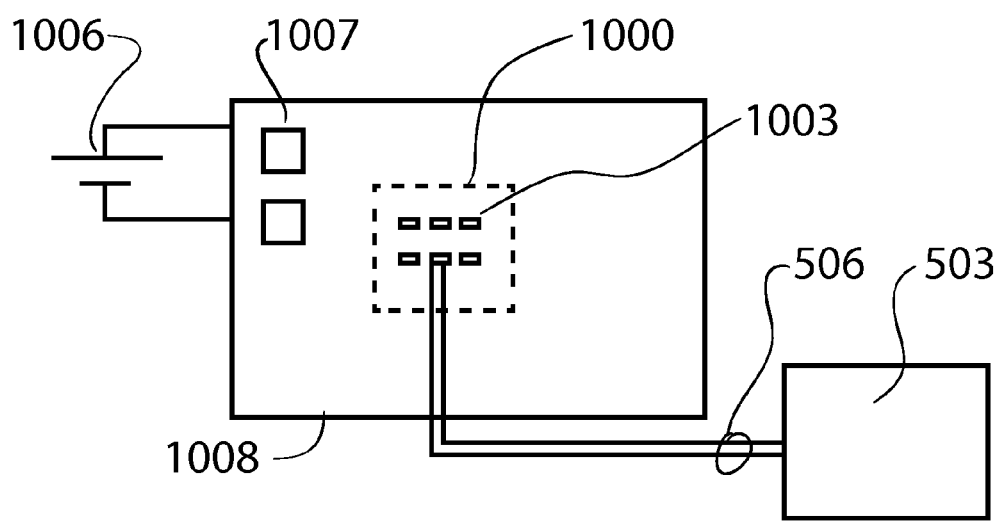
FIG. 10 shows the connection of the apparatus to a DUT with multiple power supplies.

Another aspect of the design is shown in FIG. 10, where the apparatus 503 is again our switching element with control system used to insert a fault. Instead of the DUT 1000 being powered directly from power supply 1006, a plurality of voltage regulators 1007 generate intermediate voltages used by DUT 1000. In this figure the DUT 1000 is mounted on a printed circuit board 1008; this figure shows the DUT 1000 on the backside of this circuit board. On the frontside of the printed circuit board 1008 a plurality of decoupling capacitors 1003 are mounted, with decoupling capacitors connected to the plurality of voltage regulators 1007 through the power distribution network on the printed circuit board.

When connecting the apparatus 503 to the DUT using probes 506, it may be required to determine the correct power distribution network to connect this apparatus to. For example some of the decoupling capacitors 1003 might be used for the power supply to the processor core subsystem inside the DUT 1000, other decoupling capacitors might connect to the memory subsystem inside the DUT 1000, and other decoupling capacitors to the peripheral subsystem inside the DUT 1000.

These connections using probes 506 are made such that the perturbations introduced by the switching element of the test apparatus 503 affect the power supply for the desired subsystem of the DUT 1000. In practical systems, this could mean the probes connecting to decoupling capacitors or vias physically closest to DUT 1000. This avoids needing to significantly modify the printed circuit board 1008 on which the DUT 1000 is mounted. This allows the fault injection testing using the apparatus 503 to be performed on a DUT 1000 configured in a manner which most closely resembles the final configuration in which DUT 1000 will be deployed.

Figure 11:
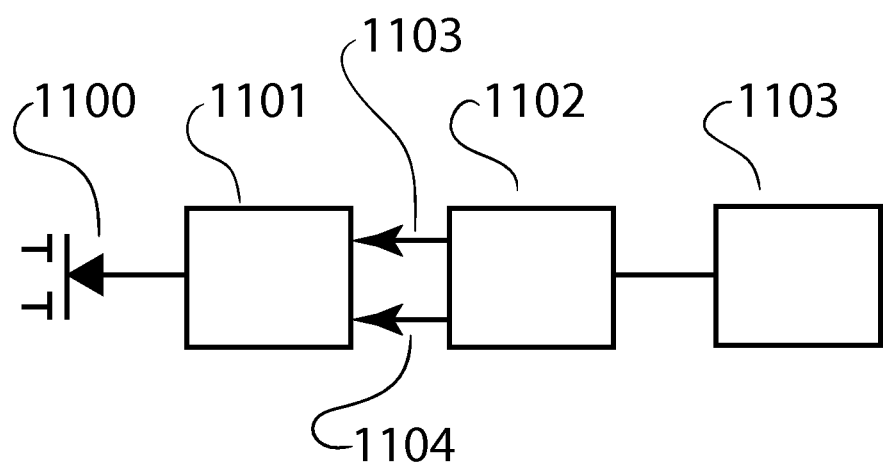
FIG. 11 shows details of the control system, including a separate pulse generator.

A possible embodiment of the controller (such as invoked in block 504, 606, 803, and 905) is shown in FIG. 11. The switching element 1100 is repeated in this diagram, however the controller is normally assumed to be logically separate from the switching element 1100. A pulse generator 1101 is capable of generating short pulses, the width of the pulse is controlled by control system 1102. The connection 1104 between the control system 1102 and pulse generator 1101 configures the width of the pulse from pulse generator 1101. The pulse generator 1101 is designed only to generate short (sub-millisecond) pulses, as longer pulses are likely to cause undesired faults such as resets instead of desired faults such as memory corruption.

Specifically what constitutes a desired or successful fault will depend not only on the DUT, but the intention of the user controlling the apparatus. A user testing a fault-tolerant algorithm might desire certain memory values are corrupted, whereas another user attempting to bypass security measures might desire a branch instruction to be incorrectly executed.

The temporal location of the pulses is also controlled by the control system 1102, where the control system 1102 has a trigger 1103 connected to the pulse generator 1101. The control system 1102 may receive information from a connection to another element 1103. Depending on the embodiment of the apparatus this element 1103 can take many forms. In block 504, where the apparatus is a stand-alone piece of test equipment, this element 1103 might be a personal computer which allows the user to enter desired pulse widths and temporal locations.

The control system 1102 might also perform a sweep of pulse parameters such as width and temporal location to determine the required settings for causing the desired faults in the DUT. Such a sweep might involve the use of element 1103 for configuring the sweep parameters, or the use of element 1103 for determining when the fault injection was successful. As an example when implementing the control system from block 606 which is part of an embedded system, the element 1103 might be a connection to the DUT 600. Here the DUT 600 is performing a self-test, and needs to inform the control system 606 when to perform the fault injection test, along with parameters of the pulse width and location.

Figure 12:
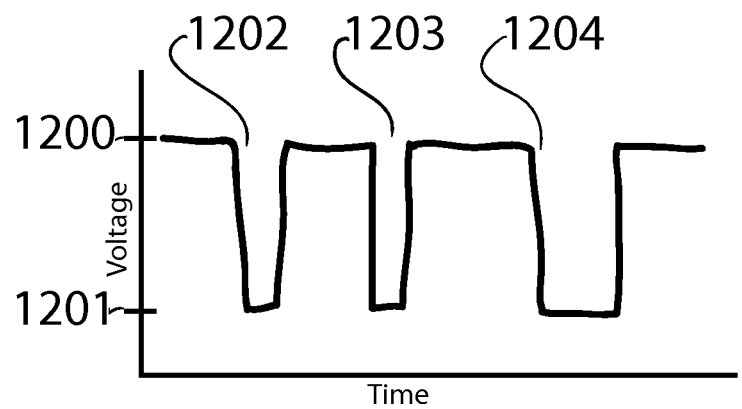
FIG. 12 shows an example of multiple voltage perturbations.

The insertion of faults may require multiple voltage perturbations to generate a single fault. This is shown in FIG. 12, where the normal operating voltage 1200 is perturbed to level 1201 using a switching element across the power supply. Perturbations 1202, 1203, and 1204 are inserted at specific temporal locations. Each perturbation may have different pulse widths, with the objective of causing a desired fault in the device operating on this power supply.

While exemplary embodiments of the present invention have been described with respect to standard digital and analog blocks, as would be apparent to one skilled in the art, various functions may be implemented in the digital domain as processing steps in a software program, in hardware by circuit elements or state machines, or in combinations of both software and hardware. Such software may be employed in, for example, a digital signal processor, microcontroller, or general-purpose computer. Such hardware and software may be embodied within circuits implemented within an integrated circuit.

Thus, the functions of the present invention can be embodied in the form of methods and apparatuses for practising those methods. One or more aspects of the present invention can be embodied in the form of program code, for example, whether stored in a storage medium, loaded into and/or executed by a machine, or transmitted over some transmission medium, wherein, when the program code is loaded into and executed by a machine, such as a computer, the machine becomes an apparatus for practising the invention. When implemented on a general-purpose processor, the program code segments combine with the processor to provide a device that operates analogously to specific circuits.

It is to be understood that the embodiments and variations shown and described herein are merely illustrative of the principles of this invention and that various modifications may be implemented by those skilled in the art without departing from the scope and spirit of the invention.

What is claimed:

1. An apparatus for causing at least one fault in an internal state of a device under test ('DUT'), wherein the DUT is an embedded system or an integrated circuit, the apparatus comprising:
    a switching element configured to short a power supply of the DUT, such that the switching element causes a perturbation in the power supply for the DUT;
    a pulse generator configured to generate pulses with pulse widths lasting less than one millisecond, an output of said pulse generator configured to operate the switching element; and
    a control system configured to control said pulse widths, and to control temporal locations of said pulses where said pulse generator is activated.

2. The apparatus of claim 1 wherein the switching element is a Field Effect Transistor ('FET').

3. The apparatus of claim 1 wherein the switching element is a Metal Oxide Field Effect Transistor ('MOSFET').

4. The apparatus of claim 1 wherein a determination of a temporal location to enable said switching element is performed by monitoring an indicator of the internal state of the DUT.

5. The apparatus of claim 1 wherein the DUT is located in a same embedded system as said apparatus.

6. The apparatus of claim 1 wherein the DUT is temporarily connected to said apparatus using probes.

7. The apparatus of claim 1 wherein the apparatus is made an integral and permanent part of the DUT.

8. The apparatus of claim 1 wherein the apparatus communicates with said DUT, said DUT executing instructions or performing operations in response to communications with the apparatus.

9. A method for injecting faults into an embedded digital system or an integrated circuit, defined as the Device Under Test (DUT), the method comprising:
    temporarily causing a plurality of voltage perturbations in a power supply of the DUT, the voltage perturbations caused by a switching element configured to short the power supply of the DUT, wherein the voltage perturbations occur for short periods of times with controlled lengths of the voltage perturbations and controlled temporal locations of the voltage perturbations; and
    monitoring the DUT to determine if a fault condition has occurred.

10. The method of claim 9, further comprising: adjusting a width and a temporal location of said plurality of voltage perturbations by either sweeping through a range of possible voltage perturbation widths and locations, randomly selecting widths and temporal locations of said voltage perturbations, or using a search algorithm for the widths and temporal locations of said voltage perturbations; and
    recording if a desired fault occurred for each said pulse width and temporal location.

11. The method of claim 9, further comprising:
    determining the temporal location where said faults are injected by using an indicator of an internal state of the DUT.

12. The method of claim 9, further comprising:
    determining the temporal location where said faults are injected by using a control signal from the DUT.

13. A computer-readable storage medium that is not a transient signal, the computer-readable storage medium having stored thereon instructions that, when executed by one or more processors, cause an apparatus to at least perform the following:
    cause a switching element to short one or more power supplies used by a Device Under Test ('DUT'), said DUT being an embedded digital system or an integrated circuit, said short(s) causing a perturbation in the power supply of the DUT; and
    control the width and location of said short(s) to cause a desired fault condition(s) in the DUT, while avoiding undesired fault condition(s).

14. The computer-readable storage medium of claim 13, wherein the apparatus is caused to: communicate with the DUT, the DUT executing instructions or performing operations in response to communications with the apparatus.

15. The computer-readable storage medium of claim 14, wherein the apparatus is caused to: make a determination if a fault has been introduced into the DUT and record said determination in an electronic database.

16. The computer-readable storage medium of claim 13, wherein the apparatus is caused to: modify a length of time and a temporal location which the switching element is enabled for.

* * * * *